(12) United States Patent
Fratti

(10) Patent No.: US 7,724,023 B1
(45) Date of Patent: May 25, 2010

(54) CIRCUIT APPARATUS INCLUDING REMOVABLE BOND PAD EXTENSION

(75) Inventor: Roger A. Fratti, Mohnton, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/463,718

(22) Filed: May 11, 2009

(51) Int. Cl.
*H03K 19/00* (2006.01)
*G01R 31/26* (2006.01)

(52) U.S. Cl. .......................... 326/16; 324/765; 365/201

(58) Field of Classification Search .................. 326/16; 324/763, 765; 365/201; 257/48
See application file for complete search history.

(56) References Cited

U.S. PATENT DOCUMENTS 6,240,014 B1 * 5/2001 Yoo ...................... 365/185.09
6,720,785 B2 * 4/2004 Bette ......................... 324/765
6,930,937 B2 * 8/2005 Lay .............................. 365/201

* cited by examiner

*Primary Examiner*—James Cho

(57) ABSTRACT

Embodiments of the invention include an electrical circuit arrangement including a switchably removable bond pad extension test pad that allows improved testing of a corresponding electrical circuit device via enhanced placement of testing probes. The bond pad extension test pad is removably coupled to one of the electrical circuit device's electrical components, e.g., a bond pad. Because the bond pad extension test pad can be disconnected from the electrical component when not testing, the bond pad extension test pad does not contribute additional parasitic effects to the corresponding electrical circuit device. The electrical circuit arrangement automatically detects when a testing voltage is applied to the bond pad extension test pad, then connects the bond pad extension test pad in response to the detection of the applied testing voltage. When a testing voltage is not applied to bond pad extension test pad, the electrical circuit arrangement disconnects the test pad from the associated electrical component.

22 Claims, 5 Drawing Sheets

CIRCUIT APPARATUS INCLUDING REMOVABLE BOND PAD EXTENSION

BACKGROUND OF THE INVENTION

1. Field of the Invention

The invention relates to electrical circuit devices including bond pads. More particularly, the invention relates to electrical circuit devices including bond pad extensions used for testing electrical circuit devices.

2. Description of the Related Art

Bond pads are used with wire bonding techniques for mounting electrical circuit devices, such as semiconductor integrated circuit dies, in electronic packaging. The electrical circuit devices typically include a plurality of relatively small conductive leads that are electrically connected, e.g., by ultrasonic bonding, to wire bond pads of corresponding conductors embedded in the device package.

Some conventional circuit device arrangements include extended bond pads, which are bond pads that have an extended area or region that allows extra room for the placement of test probes during testing of the circuit device. However, in such conventional arrangements, the extended bond pads typically remain in place after testing of the circuit device has been completed. As such, the extended bond pads can add extra capacitance or, at relatively high frequencies, add open-circuited stubs to the circuit device. Such open-circuited stubs are capacitive in nature and exhibit resonances that may result in the undesirable radiation of signals. Other conventional circuit device arrangements include extended bond pads that are broken off or peeled away from the real or original bond pad after testing is performed. However, in such arrangements, subsequent use of the extended bond pads is not possible once the extended bond pad has been permanently removed from the circuit device.

Therefore, a need exists for a reusable, removable, extended bond pad or bond pad extension that does not include or contribute additional parasitic effects to the existing parasitic effects of the associated electrical circuit device.

SUMMARY OF THE INVENTION

The invention is embodied in an electrical circuit arrangement that includes at least one switchably removable bond pad extension test pad that allows for improved testing of a corresponding electrical circuit device via enhanced placement of testing probes. The bond pad extension test pad is removably coupled to the electrical circuit device, e.g., via one of the electrical circuit device's bond pads, which are used for wire bonding the integrated circuit portion of the electrical circuit device to components external to the electrical circuit device. The electrical circuit arrangement includes a controllable switch coupled between the bond pad extension test pad and the bond pad or other suitable device circuitry. The controllable switch includes at least one enable control input for enabling and disabling the controllable switch, and is configured in such a way that when the controllable switch is enabled the bond pad extension test pad is electrically connected to the bond pad or other device circuitry, and when the controllable switch is disabled the bond pad extension test pad is electrically isolated from the bond pad or other device circuitry. A control circuit coupled to the controllable switch and to the bond pad extension test pad operates to enable the controllable switch when the control circuit detects a testing voltage applied to the bond pad extension test pad, and to disable the controllable switch when the control circuit detects no testing voltage applied to the bond pad extension test pad. Because the bond pad extension test pad can be disconnected from the bond pad or other device circuitry after testing, and thus removed from the electrical circuit device, the bond pad extension test pad does not contribute additional parasitic effects to the corresponding electrical circuit device. The electrical circuit arrangement automatically detects when a testing voltage is applied to the bond pad extension test pad, then connects the bond pad extension test pad in response to the detection of the applied testing voltage. When the testing voltage applied to bond pad extension test pad is removed, the electrical circuit arrangement disconnects the bond pad extension test pad from the associated bond pad or other device circuitry.

DETAILED DESCRIPTION OF EXEMPLARY EMBODIMENTS

Figure 1:
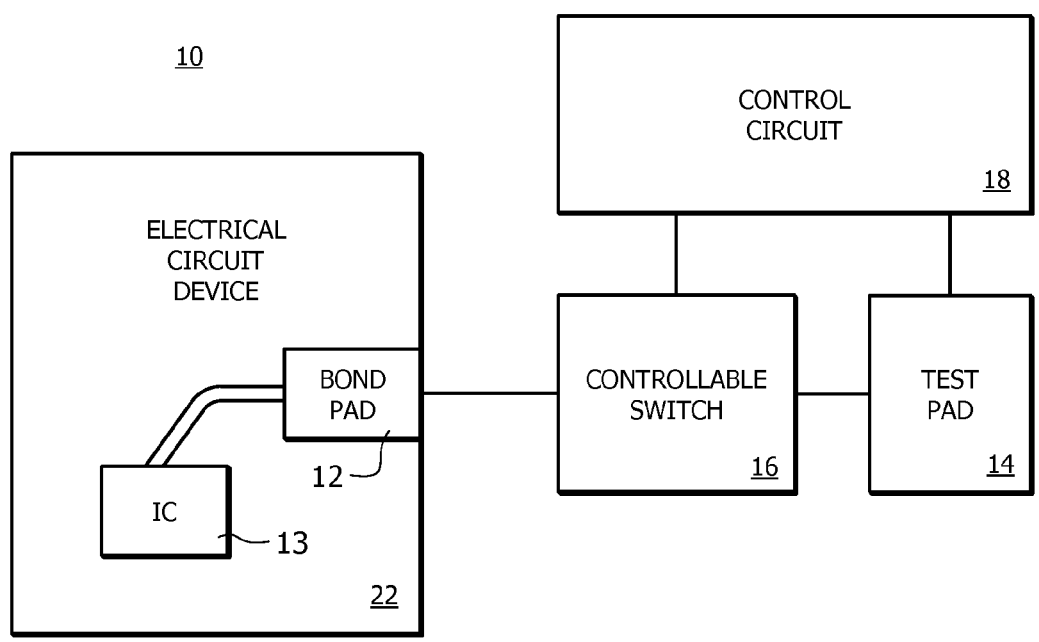
FIG. 1 is a block diagram illustrating a bond pad extension test pad arrangement according to embodiments of the invention.

In the following description, like reference numerals indicate like components to enhance the understanding of the invention through the description of the drawings. Also, although specific features, configurations and arrangements are discussed hereinbelow, it should be understood that such is done for illustrative purposes only. A person skilled in the relevant art will recognize that other steps, configurations and arrangements are useful without departing from the spirit and scope of the invention.

Embodiments of the invention are directed to providing a bond pad extension test pad that can be used for testing a corresponding electrical circuit but then is automatically removed from the electrical circuit upon the removal of the applied testing voltage to the bond pad extension test pad. The removal of the bond pad extension test pad from the corresponding electrical circuit prevents any extra parasitic effects associated with the bond pad extension test pad from being added to the corresponding electrical circuit, such as substrate noise, substrate coupling and skin effects. For example, the bond pad extension test pad, when connected to the corresponding electrical circuit, can be used to inject high speed radio frequency (RF) test signals into the electrical circuit through lengthy transmission lines that, upon the removal of the bond pad extension test pad from the corresponding electrical circuit, do not load the actual high speed RF circuitry.

Referring now to FIG. 1, shown is a block diagram illustrating a bond pad extension test pad arrangement 10 according to embodiments of the invention. The bond pad extension test pad arrangement 10 can be coupled to an electrical circuit device 22, via any suitable component within the electrical circuit device 22, such as a bond pad 12. The bond pad extension test pad arrangement 10 includes a bond pad extension test pad or test pad 14, a controllable switch 16 coupled between the bond pad 12 and the bond pad extension test pad 14, and a control circuit 18 coupled to the controllable switch 16 and to the bond pad extension test pad 14.

It should be understood that the bond pad extension test pad arrangement 10 is useful with any suitable circuitry associated with an electrical circuit device, e.g., internal circuitry within an electrical circuit device, including bond pads. Therefore, not only can the bond pad extension test pad arrangement 10 be used for connection to and disconnection from an electrical circuit device bond pad, but also for connection to and disconnection from other internal circuitry within an electrical circuit device. Accordingly, the bond pad extension test pad arrangement 10 is useful for internal testing of electrical components within an electrical circuit device, as well as for connections to and disconnections from electrical components within an electrical circuit device.

The bond pad 12 can be any suitable bond pad electrically coupled to one or more integrated circuits (ICs) in an appropriate electrical circuit device 22. Typically, the bond pad 12 is used for wire bonding the integrated circuit portion of the electrical circuit device to components (not shown) external to the electrical circuit device 22.

Figure 2:
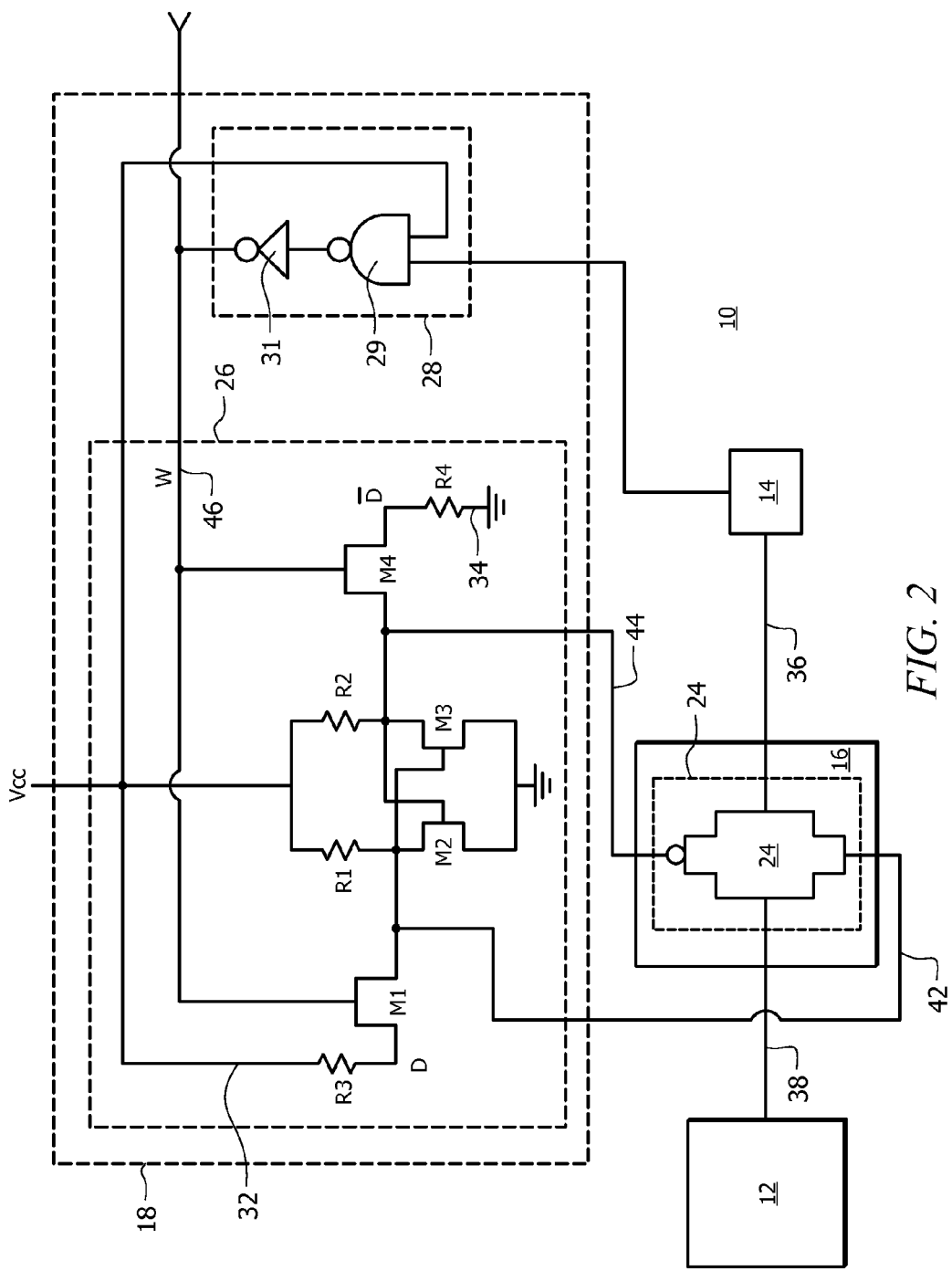
FIG. 2 is a block diagram illustrating a bond pad extension test pad arrangement according to embodiments of the invention, including a transmission gate switch and a static random access memory (SRAM) control circuit.

The controllable switch 16 can be any suitable switch that can removably couple the test pad 14 to the bond pad 12 in such a way that the bond pad extension test pad 14 is electrically connected to the bond pad 12. For example, the controllable switch 16 can be a transmission gate, as shown in FIG. 2 and discussed in greater detail hereinbelow. A transmission gate is an electronic element that can isolate a component or components, e.g., from live signals during hot insertion or removal.

The control circuit 18 can be any suitable control circuit that can properly operate the controllable switch 16 in the manner discussed herein. For example, the control circuit 18 can include a static random access memory (SRAM) cell, and other control logic, as shown in FIG. 2 and discussed in greater detail hereinbelow. In some cases, the control circuit 18 can be controlled by built-in self-test (GIST) functionality.

As will be discussed in greater detail hereinbelow, the control circuit 18 switchably connects the bond pad extension test pad 14 to the bond pad 12 by controlling the operation of the controllable switch 16, i.e., by turning on the controllable switch 16 to electrically connect the bond pad extension test pad 14 to the bond pad 12 and by turning off the controllable switch 16 to electrically disconnect or electrically isolate the bond pad extension test pad 14 from the bond pad 12. The control circuit 18 controls the operation of the controllable switch 16 based on whether or not the bond pad extension test pad 14 has a testing voltage or testing signal, e.g., from a testing probe, applied thereto.

Referring now to FIG. 2, shown is a block diagram illustrating the bond pad extension test pad arrangement 10, in which the controllable switch 16 includes a transmission gate 24 and the control circuit 18 includes an SRAM cell 26 coupled to the transmission gate 24. The control circuit 18 also is coupled to the bond pad extension test pad 14, e.g., via an arrangement 28 of additional logic. According to embodiments of the invention, the bond pad extension test pad 14 can have some leakage component (not shown) added thereto, however, such is not necessary.

The SRAM cell 26 includes a plurality of transistors M1-M4, with transistors M2 and M3 cross-coupled together directly and via resistors R1 and R2, respectively, as shown. A data line 32 of the SRAM cell 26 is formed by the connection of transistor M1 and transistor M2, and a resistor R3, as shown. A data bar or data complement line 34 of the SRAM cell 26 is formed by the connection of transistor M4 and transistor M3, and a resistor R4, as shown. The data line 32 is coupled to the source voltage $V_{CC}$ (i.e., tied "high") and the data complement line 34 is coupled to ground (i.e., tied "low").

The transmission gate 24 is coupled between the bond pad 12 and the bond pad extension test pad 14. More specifically, the transmission gate 24 has an input coupled via a connection 36 to the bond pad extension test pad 14 and an output coupled via a connection 38 to the bond pad 12. The transmission gate 24 also includes a first control or enable input coupled via a connection 42 to the SRAM cell 26 between transistors M1 and M2, and a second, complementary control or enable input coupled via a connection 44 to the SRAM cell 26 between transistors M3 and M4.

The transmission gate 24 is turned "on" when a logical "high" or logical "1" voltage is applied to the first control or enable input and a logical "low" or logical "0" is applied to the second, complementary control or enable input. When the transmission gate 24 is turned "on," the transmission gate input is electrically connected to the transmission gate output. Thus, in this application, when the transmission gate 24 is turned "on," the bond pad extension test pad 14, via the connection 36, will be electrically connected to the bond pad 12, via the connection 38. Also, in operation, the transmission gate 24 is turned "off" when a logical "low" or logical "0" voltage is applied to the first control or enable input and a logical "high" or logical "1" is applied to the second, complementary control or enable input. When the transmission gate 24 is turned "off," the transmission gate input is electrically isolated or disconnected from the transmission gate output. Thus, when the transmission gate 24 is turned "off," the bond pad 12 will be electrically isolated from the bond pad extension test pad 14.

The SRAM cell 26 includes a write line (W) 46 to which the bond pad extension test pad 14 is coupled, via the appropriate logic arrangement 28. For example, the arrangement 28 can include a NAND gate 29 with a first input coupled to the bond pad extension test pad 14, a second input coupled to the data line 32 of the SRAM cell 26, and an output coupled to the input of an inverter 31, which has an input coupled to a write line 46 of the SRAM cell 26. Alternatively, the logic arrangement 28 can be a more complex combination using D-type flip-flops or other one-shot type circuitry.

As discussed hereinabove, the bond pad 12 is a conventional bond pad that typically is or will be wire bonded to external circuitry (not shown). During testing of the circuitry of the electrical circuit device to which the bond pad 12 and the arrangement 10 belongs, the testing probe makes contact with the bond pad extension test pad 14 instead of the bond pad 12. Thus, the bond pad 12 is not touched by any testing probes during any testing, therefore preserving the bonding ability of the bond pad 12. In this manner, the bond pad extension test pad 14 can be repeatedly gouged by testing probes without adversely affecting the bonding ability of the bond pad 12.

In operation, when the circuitry to which the bond pad extension test pad arrangement belongs is not powered up, the SRAM cell 26 is collapsed and not functioning. When the source voltage $V_{cc}$ is applied to the circuitry to which the bond pad extension test pad arrangement belongs, e.g., for testing purposes, the SRAM cell 26 and other portions of the control circuit 18 are powered up. At this stage in the testing process, no data is written into the SRAM cell 26 because the write line 46 is not yet energized.

When a testing probe is applied to the bond pad extension test pad 14, the write line 46 of the SRAM cell 26 is energized. When the write line 46 of the SRAM cell 26 becomes energized, an appropriate signal is latched in the SRAM cell 26 is such a way that the connection 42 applies a logical "high" to the first control or enable input of the transmission gate 24 and a logical "low" to the second, complementary control or enable input of the transmission gate 24, thus turning "on" the transmission gate 24. When the transmission gate 24 is turned "on," test signals from the testing probe applied to the bond pad extension test pad 14 can pass between the bond pad extension test pad 14 and the bond pad 12. As discussed hereinabove, the testing probe does not touch the bond pad 12 even though the bond pad 12 is receiving test signals.

When the testing probe is removed from the bond pad extension test pad 14, the write line 46 of the SRAM cell 26 no longer is energized. As such, within the SRAM cell 26, the connection 42 to the first control or enable input of the transmission gate 24 becomes a logical "low" and the connection 44 to the second, complementary control or enable input of the transmission gate 24 becomes a logical "high," thus turning "off" the transmission gate 24. As discussed hereinabove, when the transmission gate 24 is turned "off," the bond pad extension test pad 14 is electrically isolated from the bond pad 12.

As the operation of the bond pad extension test pad arrangement 10 illustrates, the testing of an electrical circuit arrangement and the electrical circuit device to which the electrical circuit arrangement belongs can be performed without testing probes making contact with the bond pad 12. Accordingly, the bond pad 12 is not subjected to the potential physical damage caused by the repeated probing and gouging of test probes, e.g., during testing processes, thus preserving the bonding ability of the bond pad 12.

Although the bond pad extension test pad arrangement 10 shown in FIG. 2 includes an SRAM cell in the control circuit 18, other control circuit arrangements can be used according to embodiments of the invention. For example, instead of using an SRAM cell 26, the control circuit 18 can include a circuit arrangement of NAND logic that is configured to sense applied voltages to the bond pad extension test pad 14 and to sense logical "highs" and logical "lows" on the first and second enable inputs of the transmission gate 24 to control the operation of the transmission gate 24 in the manner described hereinabove. However, the use of an SRAM cell in the control circuit 18 can be advantageous in that an SRAM cell arrangement does not include separate write line control, e.g., from a scan line test stream or other clocking signal.

Figure 3:
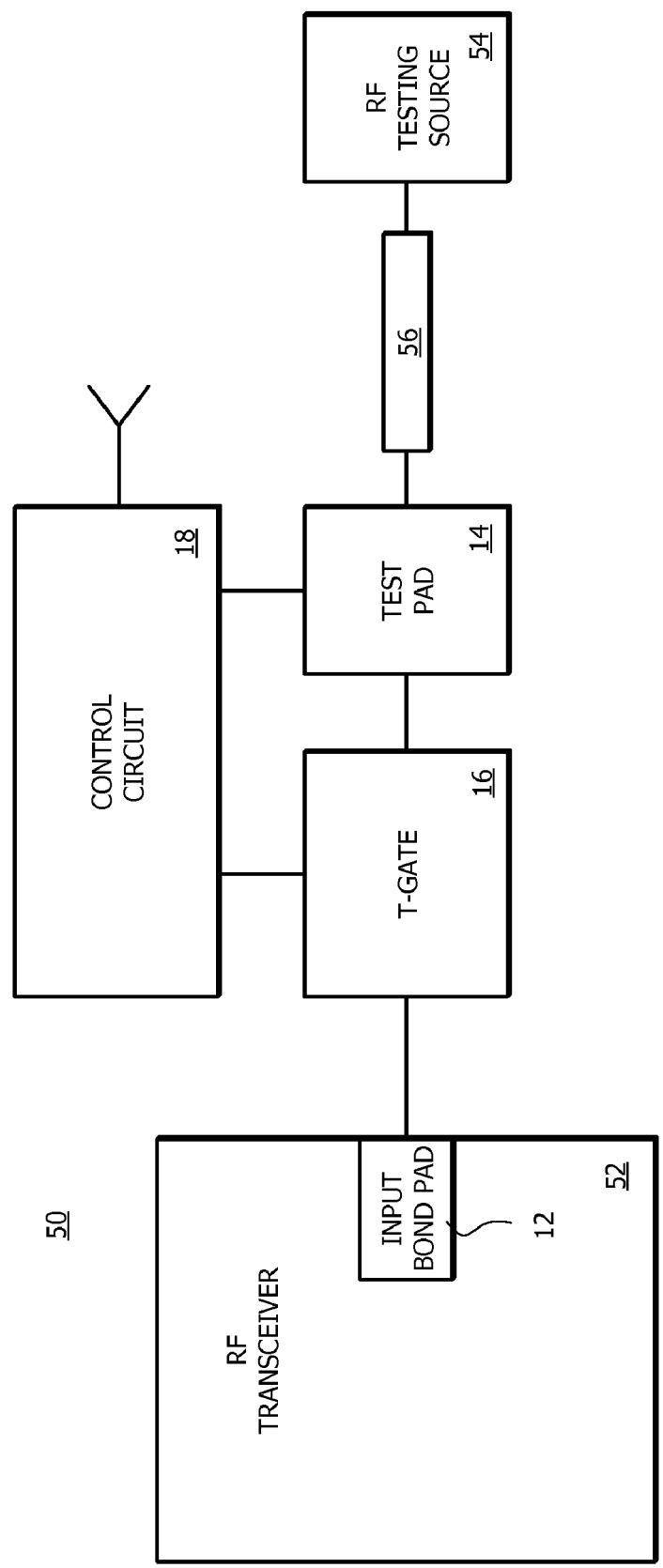
FIG. 3 is a block diagram illustrating a bond pad extension test pad arrangement according to embodiments of the invention in use with a radio frequency (RF) transceiver.

Referring now to FIG. 3, shown is a block diagram illustrating a bond pad extension test pad arrangement 50 according to embodiments of the invention for providing high speed testing to high speed inputs, such as the low noise amplifier (LNA) input of an RF transceiver. The arrangement 50 includes one or more bond pads 12, such as an RF input pad for an RF transceiver 52. The arrangement 50 also includes a transmission gate or other appropriate controllable switch 16 coupled to the bond pad 12, the bond pad extension test pad 14 coupled to the controllable switch 16, and the control circuit 18 coupled to the controllable switch 16 and the bond pad extension test pad 14. The bond pad extension test pad 14 also is coupled to an RF testing source 54, e.g., via an input transmission line 56.

The RF testing source 54 is configured to inject a high speed test signal into the low noise amplifier at the input of the RF transceiver 52. However, the low noise amplifier (not shown) typically is sensitive to input loading, and thus the bond pad 12 should not be disturbed during active RF testing.

Therefore, in operation, in the manner discussed hereinabove, when the control circuit 18 detects that a testing signal or testing voltage has been applied to the bond pad extension test pad 14 by the RF testing source 54, the control circuit 18 enables the controllable switch 16 to allow the high speed test signal to be injected into the input of the low noise amplifier in the RF transceiver 52. When testing is complete, i.e., when a testing signal no longer is applied to the bond pad extension test pad 14 by the RF testing source 54, the control circuit 18 disables the controllable switch 16, thus electrically disconnecting or isolating the RF testing source 54, along with the transmission line 56, from the input of the low noise amplifier in the RF transceiver 52.

Figure 4:
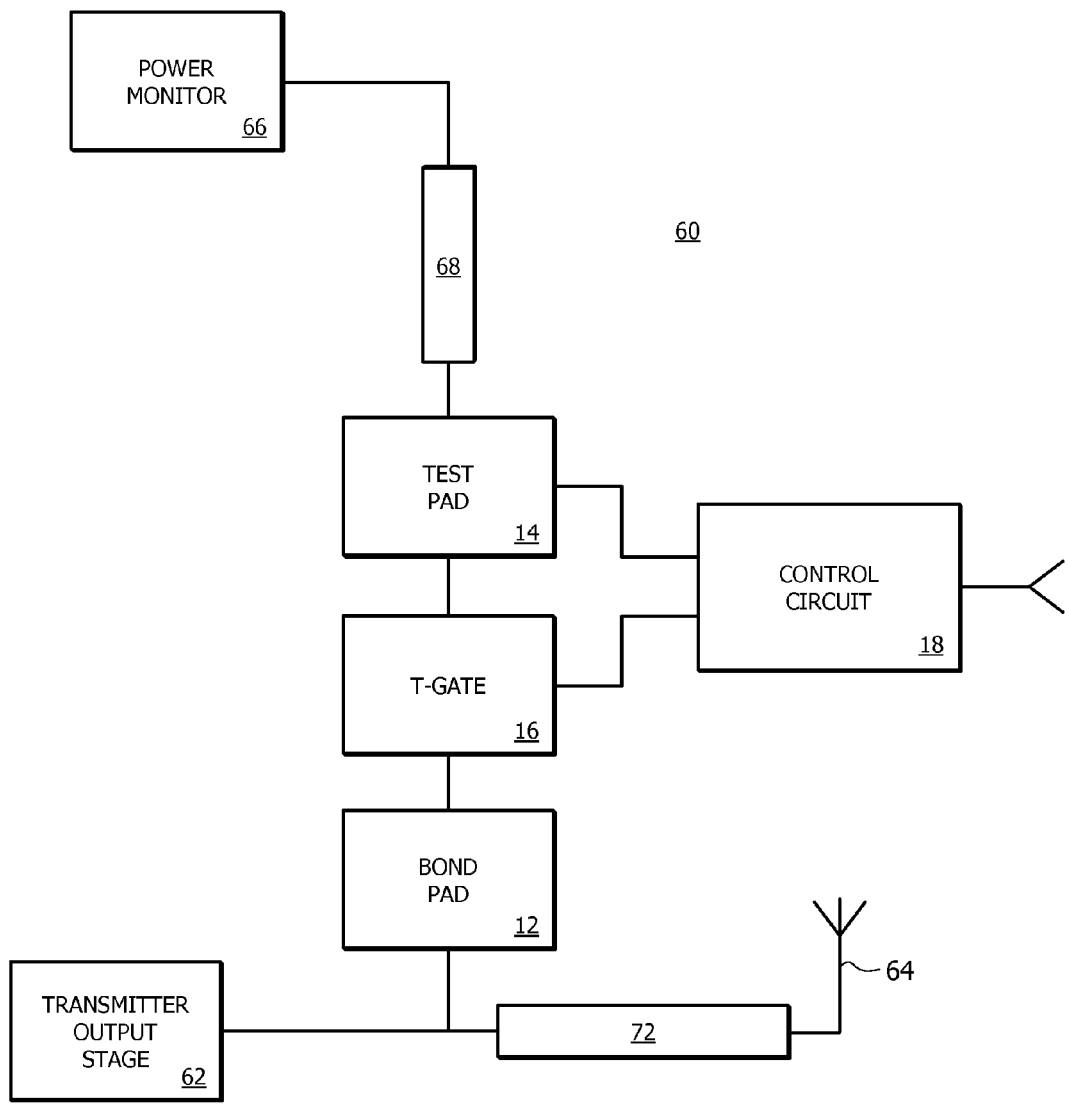
FIG. 4 is a block diagram illustrating a bond pad extension test pad arrangement according to embodiments of the invention for use in radio frequency (RF) transmission power monitoring.

Referring now to FIG. 4, shown is a block diagram illustrating a bond pad extension test pad arrangement 60 according to embodiments of the invention for use in radio frequency (RF) transmission power monitoring. For example, the arrangement 60 illustrates a bond pad extension test pad arrangement used in an application where an RF transmitter, via a transmitter output stage 62, is coupled to an antenna 64, such as a printed antenna. The arrangement 60 includes a power monitor or detector 66 coupled to the bond pad extension test pad 14, e.g., via a transmission line 68. The bond pad extension test pad 14 is coupled to the controllable switch 16 (e.g., a transmission gate), which also is coupled to the bond pad 12. The control circuit 18 is coupled to the controllable switch 16 and the bond pad 12 in the manner described previously herein.

According to embodiments of the invention, the bond pad extension test pad arrangement provides a stub for tapping off a portion of the RF transmitter output power when the power monitor 66 is applied to the bond pad extension test pad 14. Typically, such stub or tap provided by the bond pad extension test pad arrangement is coupled to a relatively low impedance point on an output matching network 72 between the transmitter output stage 62 and the antenna 64. Typically, the output matching network 72 is configured to have an impedance that matches or approximately matches the impedance of the transmission line 68.

In operation, when the power monitor 66 is coupled to the bond pad extension test pad 14, and the power monitor 66 is turned on or powered up, the control circuit 18 detects the presence of the power monitor 66 via the bond pad extension test pad 14 and, in response thereto, enables the controllable switch 16, thus electrically connecting the bond pad extension test pad 14 to the bond pad 12. With the bond pad 12 coupled to the output matching network 72, the output power from the transmitter output stage 62 can be measured or monitored by the power monitor 66. When the transmitter output stage 62 is not being tested, e.g., when the power monitor 66 is turned off or powered down, the control circuit 18 disables the controllable switch 16, thus electrically disconnecting or isolating the power monitor 66 and the transmission line 68 from the transmitter output stage 62. Otherwise, having the power monitor 66 and the transmission line 68 remaining electrically connected to the transmitter output stage 62 of the RF transmitter would be detrimental to the operation of the RF transmitter.

Figure 5:
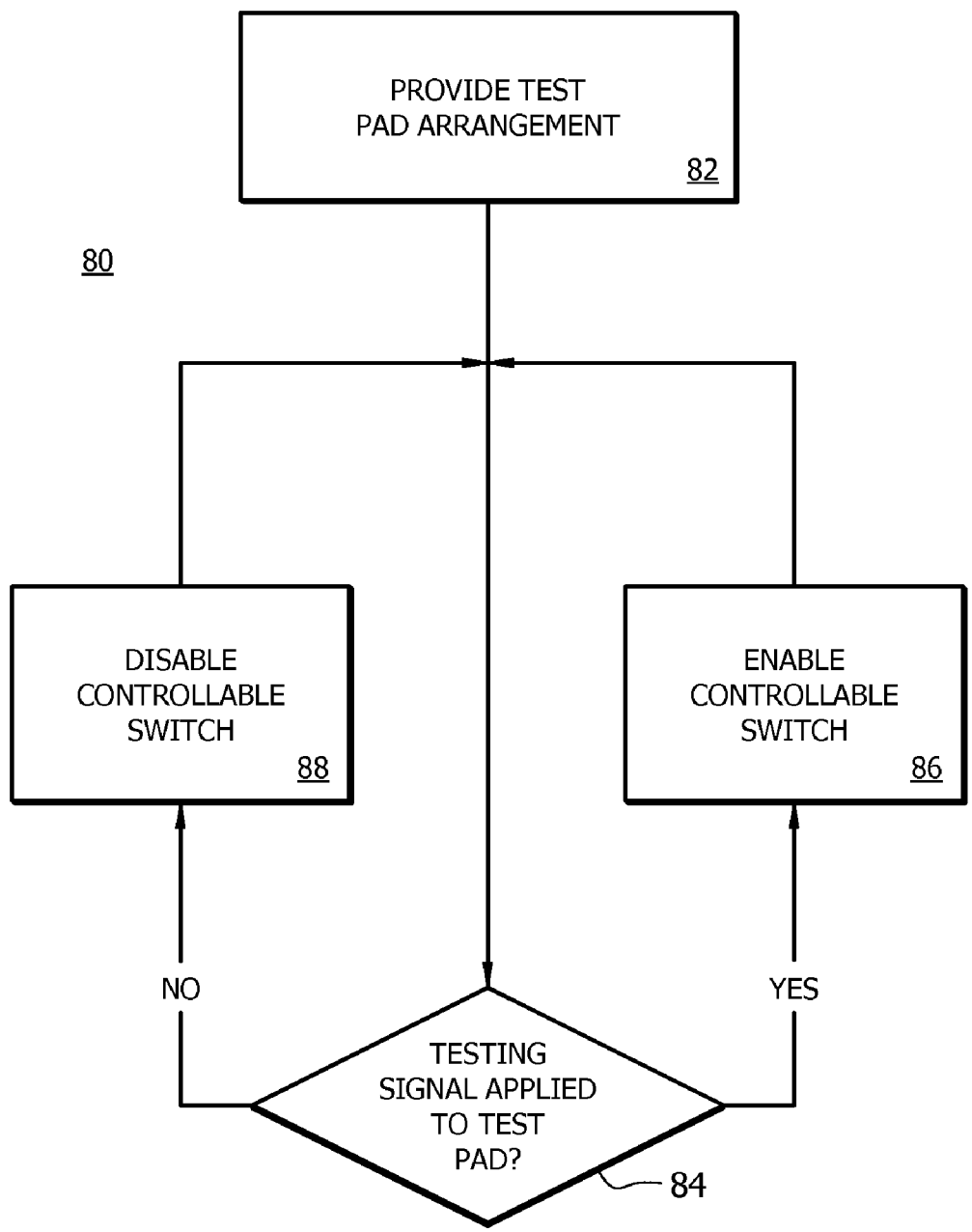
FIG. 5 is a block diagram illustrating a method for testing an electrical circuit using a bond pad extension test pad arrangement according to embodiments of the invention.

Referring now to FIG. 5, shown is a block diagram illustrating a method 80 for testing an electrical circuit using a bond pad extension test pad arrangement according to embodiments of the invention. The method 80 includes a step 82 of providing a bond pad extension test pad arrangement according to embodiments of the invention, e.g., an arrangement in which the bond pad extension test pad 14 is coupled to the bond pad 12 via the controllable switch 16, and the control circuit 18 is coupled to the bond pad extension test pad 14 and coupled to the controllable switch 16, e.g., as shown in FIGS. 1-4 and described hereinabove. The method 80 also includes a step 84 of determining or detecting whether or not a testing signal is applied to the bond pad extension test pad 14. For example, a testing probe configured to generate a testing signal can apply a testing signal to the bond pad extension test pad 14 by probing or contacting the testing probe to the bond pad extension test pad 14. As discussed herein, the testing probe does not make contact with the bond pad 12.

The method 80 also includes a step 86 of enabling the controllable switch 16. As discussed hereinabove, the control circuit 18 is configured to enable the controllable switch 16 in response to the control circuit 18 detecting that a testing signal has been applied to the bond pad extension test pad 14. If the control circuit 18 detects that a testing signal has been applied to the bond pad extension test pad 14 (Y), the control circuit 18 enables the controllable switch 16, thus electrically connecting the bond pad extension test pad 14 to the bond pad 12. Once the step 86 of enabling the controllable switch 16 has been performed, the method 80 returns to the step 84 of determining or detecting whether or not a testing signal is applied to the bond pad extension test pad 14. Therefore, as long as a testing signal is applied to the bond pad extension test pad 14, the control circuit 18 will continue to enable the controllable switch 16, thus allowing the bond pad extension test pad 14 to be electrically coupled to the bond pad 12 and allowing the testing signal to be applied to the bond pad 12 and the electrical circuit to which the bond pad 12 belongs.

The method 80 also includes a step 88 of disabling the controllable switch 16. As discussed hereinabove, the control circuit 18 is configured to disable the controllable switch 16 if the control circuit 18 does not detect a testing signal applied to the bond pad extension test pad 14. If the control circuit 18 does not detect a testing signal applied to the bond pad extension test pad 14 (N), the control circuit 18 disables the controllable switch 16, thus electrically isolating or disconnecting the bond pad extension test pad 14 to the bond pad 12. Once the step 88 of disabling the controllable switch 16 has been performed, the method 80 returns to the step 84 of determining or detecting whether or not a testing signal is applied to the bond pad extension test pad 14. Therefore, as long as no testing signal is applied to the bond pad extension test pad 14, the control circuit 18 will keep the controllable switch 16 disabled, thus keeping the bond pad extension test pad 14 electrically isolated from the bond pad 12.

As discussed hereinabove, by probing the bond pad extension test pad 14 with the testing probe instead of the bond pad 12, the electrical circuit to which the bond pad 12 belongs can be tested without the testing probe having to make contact with the bond pad 12, thus preserving the physical integrity and maintaining the bonding ability of the bond pad 12. Also, by keeping the bond pad extension test pad 14 (and the control circuit 18) electrically isolated from the bond pad 12 when the electrical circuit to which the bond pad 12 belongs is not being tested, no additional parasitic effects that may otherwise be contributed by the bond pad extension test pad 14 are added to the electrical device to which the bond pad 12 belongs.

It will be apparent to those skilled in the art that many changes and substitutions can be made to the embodiments of the invention herein described without departing from the spirit and scope of the invention as defined by the appended claims and their full scope of equivalents.

The invention claimed is:

1. An electrical circuit arrangement for electrically isolating at least one component within an electrical circuit device, comprising:
   a bond pad extension test pad;
   a controllable switch coupled to the bond pad extension test pad and configured for coupling to the at least one component, wherein the controllable switch includes at least one enable control input for enabling and disabling the controllable switch, wherein the controllable switch is configured in such a way that when the controllable switch is enabled the bond pad extension test pad is electrically connected to the at least one component and when the controllable switch is disabled the bond pad extension test pad is electrically isolated from the at least one component; and
   a control circuit coupled to the bond pad extension test pad and coupled to the enable control input of the controllable switch,
   wherein the control circuit is configured in such a way that,
      when a testing voltage is applied to the bond pad extension test pad, the control circuit enables the controllable switch, and
      when no testing voltage is applied to the bond pad extension test pad, the control circuit disables the controllable switch.

2. The arrangement as recited in claim 1, wherein the control circuit includes a write line coupled to the bond pad extension test pad, wherein control circuit is configured in such a way that when a testing voltage is applied to the bond pad extension test pad, the write line input of the control circuit causes the control circuit to enable the controllable switch, and when no testing voltage is applied to the bond pad extension test pad, the write line input of the control circuit causes the control circuit to disable the controllable switch.

3. The arrangement as recited in claim 1,
   wherein the controllable switch includes an input coupled to the bond pad extension test pad, an output configured for coupling to the at least one component, a first enable control input and a second enable control input,
   wherein the control circuit includes a first control line coupled to the first enable control input of the controllable switch, a second control line coupled to the second enable control input of the controllable switch, and a write line coupled to the bond pad extension test pad,
   wherein the control circuit is configured in such a way that when a testing voltage is applied to the bond pad extension test pad, the control circuit applies control input signals via the first control line to the first enable control input and via the second control line to the second enable control input in such a way that the controllable switch is enabled, and
   wherein the control circuit is configured in such a way that when no testing voltage is applied to the bond pad extension test pad, the control circuit applies control input signals via the first control line to the first enable control input and via the second control line to the second enable control input in such a way that the controllable switch is disabled.

4. The arrangement as recited in claim 1, wherein the at least one component is a bond pad.

5. The arrangement as recited in claim 1, wherein the controllable switch is a transmission gate.

6. The arrangement as recited in claim 1, wherein the control circuit includes a static random access memory (SRAM) cell.

7. The arrangement as recited in claim 1, wherein the controllable switch includes a first enable control input and a second enable control input, and wherein the control circuit includes a static random access memory (SRAM) cell, wherein the SRAM cell includes
   a first transistor coupled to the bond pad extension test pad,
   a second transistor coupled to the first transistor,
   a third transistor cross-coupled to the second transistor,
   a fourth transistor coupled to the third transistor and coupled to the bond pad extension test pad,
   a first control line having a first end coupled between the first transistor and the second transistor and a second end coupled to the first enable control input of the controllable switch, and
   a second control line having a first end coupled between the third transistor and the fourth transistor and a second end coupled to the second enable control lines of the controllable switch,
   wherein, when a testing voltage is applied to the bond pad extension test pad, the SRAM cell applies a control input signal to the controllable switch via the first and second enable control lines in such a way that the controllable switch is enabled, and
   wherein, when no testing voltage is applied to the bond pad extension test pad, the SRAM cell applies a control input signal to the controllable switch via the first and second enable control inputs input in such a way that the controllable switch is disabled.

8. The arrangement as recited in claim 1, wherein the at least one component further comprises a radio frequency (RF) transceiver input bond pad and the bond pad extension test pad is coupled to an RF testing source, wherein when the RF testing source applies a testing signal to the bond pad extension test pad, the control circuit enables the controllable switch to allow the RF testing signal to be applied to the RF transceiver input bond pad, and wherein when the RF testing source is not applying a testing signal to the bond pad extension test pad, the control circuit disables the controllable switch to electrically isolate the RF testing source from the RF transceiver input bond pad.

9. The arrangement as recited in claim 1, wherein the at least one component is a bond pad coupled to a radio frequency (RF) transmitter output stage and the bond pad extension test pad is coupled to an RF power detector via a stub, wherein when the RF power detector is powered up, the control circuit detects the presence of the RF power detector coupled to the bond pad extension test pad and in response thereto enables the controllable switch to allow the RF power detector to tap off a portion of the power generated by RF transmitter output stage, and wherein when the RF power detector is not powered up, the control circuit disables the controllable switch to electrically isolate the RF power detector from the RF transmitter output stage.

10. An electrical circuit device, comprising:
   at least one component;
   an electrical circuit arrangement removably coupled to the at least one component, wherein the electrical circuit arrangement includes
      a bond pad extension test pad,
      a controllable switch coupled between the bond pad extension test pad and the at least one component, wherein the controllable switch includes at least one enable control input for enabling and disabling the controllable switch, wherein the controllable switch is configured in such a way that when the controllable switch is enabled the bond pad extension test pad is electrically connected to the at least one component and when the controllable switch is disabled the bond pad extension test pad is electrically isolated from the at least one component, and
      a control circuit having a write line input coupled to the bond pad extension test pad and having an output coupled to the enable control input of the controllable switch,
      wherein the control circuit is configured in such a way that,
         when a testing voltage is applied to the bond pad extension test pad, the control circuit enables the controllable switch, and
         when no testing voltage is applied to the bond pad extension test pad, the control circuit disables the controllable switch.

11. The device as recited in claim 10, wherein the control circuit is configured in such a way that when a testing voltage is applied to the bond pad extension test pad, the write line input of the control circuit causes the control circuit to enable the controllable switch, and when no testing voltage is applied to the bond pad extension test pad, the write line input of the control circuit causes the control circuit to disable the controllable switch.

12. The device as recited in claim 10,
   wherein the controllable switch includes an input coupled to the bond pad extension test pad, an output configured for coupling to the at least one component, a first enable control input and a second enable control input,
   wherein the control circuit includes a first control line coupled to the first enable control input of the controllable switch, a second control line coupled to the second enable control input of the controllable switch and a write line coupled to the bond pad extension test pad,
   wherein the control circuit is configured in such a way that when a testing voltage is applied to the bond pad extension test pad, the control circuit applies control input signals via the first control line to the first enable control input and via the second control line to the second enable control input in such a way that the controllable switch is enabled, and
   wherein the control circuit is configured in such a way that when no testing voltage is applied to the bond pad extension test pad, the control circuit applies control input signals via the first control line to the first enable control input and via the second control line to the second enable control input in such a way that the controllable switch is disabled.

13. The device as recited in claim 10, wherein the at least one component is a bond pad.

14. The device as recited in claim 10, wherein the controllable switch is a transmission gate.

15. The device as recited in claim 10, wherein the control circuit includes a static random access memory (SRAM) cell.

16. The device as recited in claim 10, wherein the controllable switch includes a first enable control input and a second enable control input, and wherein the control circuit includes a static random access memory (SRAM) cell, wherein the SRAM cell includes
   a first transistor coupled to the write line input,
   a second transistor coupled to the first transistor,
   a third transistor cross-coupled to the second transistor,
   a fourth transistor coupled to the third transistor and coupled to the write line input,
   a first control line having a first end coupled between the first transistor and the second transistor and a second end coupled to the first enable control input of the controllable switch, and a second control line having a first end coupled between the third transistor and the fourth transistor and a second end coupled to the second enable control input of the controllable switch, wherein, when a testing voltage is applied to the bond pad extension test pad, the SRAM cell applies a control input signal to the controllable switch via the first and second enable control lines in such a way that the controllable switch is enabled, and wherein, when no testing voltage is applied to the bond pad extension test pad, the SRAM cell applies a control input signal to the controllable switch via the first and second enable control lines in such a way that the controllable switch is disabled.

17. The device as recited in claim 10, wherein the bond pad extension test pad is coupled to the write line input via a logic arrangement, wherein the logic arrangement includes a NAND gate having an input coupled to the bond pad extension test pad and having an output, and an inverter having an input coupled to the output of the NAND gate and an output coupled to the write line input.

18. The device as recited in claim 10, wherein the at least one component further comprises a radio frequency (RF) transceiver input bond pad and the bond pad extension test pad is coupled to an RF testing source, wherein when the RF testing source applies a testing signal to the bond pad extension test pad, the control circuit enables the controllable switch to allow the RF testing signal to be applied to the RF transceiver input bond pad, and wherein when the RF testing source is not applying a testing signal to the bond pad extension test pad, the control circuit disables the controllable switch to electrically isolate the RF testing source from the RF transceiver input bond pad.

19. The device as recited in claim 10, wherein the at least one component is a bond pad coupled to a radio frequency (RF) transmitter output stage and the bond pad extension test pad is coupled to an RF power detector via a stub, wherein when the RF power detector is powered up, the control circuit detects the presence of the RF power detector coupled to the bond pad extension test pad and in response thereto enables the controllable switch to allow the RF power detector to tap off a portion of the power generated by RF transmitter output stage, and wherein when the RF power detector is not powered up, the control circuit disables the controllable switch to electrically isolate the RF power detector from the RF transmitter output stage.

20. A method for testing an electrical circuit having at least one component therein, comprising:

detecting whether a testing signal is applied to a bond pad extension test pad coupled to the at least one component via a controllable switch, wherein a control circuit is coupled to the controllable switch and coupled to the bond pad extension test pad, wherein the controllable switch is configured in such a way that when the controllable switch is enabled the bond pad extension test pad is electrically connected to the at least one component and when the controllable switch is disabled the bond pad extension test pad is electrically isolated from the at least one component;

enabling the controllable switch by the control circuit in response to the detection of a testing signal applied to the bond pad extension test pad, wherein the bond pad extension test pad is electrically coupled to the at least one component via the controllable switch in such a way that the testing signal applied to the bond pad extension test pad is applied to the at least one component; and disabling the controllable switch by the control circuit in response to no detection of an applied testing signal to the bond pad extension test pad wherein the bond pad extension test pad is electrically isolated from the at least one component via the controllable switch.

21. The method as recited in claim 20, further comprising the step of contacting a test probe configured to apply the testing signal to the bond pad extension test pad, wherein the method tests the electrical circuit without the test probe contacting the at least one component.

22. The method as recited in claim 20, wherein the at least one component is a bond pad.

* * * * *